United States Patent [19]

Minato et al.

[11] Patent Number: 4,653,025

[45] Date of Patent: Mar. 24, 1987

[54] RANDOM ACCESS MEMORY WITH HIGH DENSITY AND LOW POWER

[75] Inventors: Osamu Minato, Nishitama; Masakazu Aoki, Tokorozawa; Yuji Yatsuda, Tsukui; Katsuaki Takagi, Higashimurayama; Masashi Horiguchi, Kokubunji, all of Japan

[73] Assignee: Hitachi, Ltd., Tokyo, Japan

[21] Appl. No.: 685,132

[22] Filed: Dec. 21, 1984

[30] Foreign Application Priority Data

Dec. 23, 1983 [JP] Japan .................................. 58-242023

[51] Int. Cl.$^4$ ............................................. G11C 11/40
[52] U.S. Cl. .................................. 365/154; 365/190; 365/189
[58] Field of Search ............... 365/190, 154, 156, 174, 365/189, 230

[56] References Cited

FOREIGN PATENT DOCUMENTS 56-51088 5/1981 Japan ..................................... 365/174

OTHER PUBLICATIONS

Simi, "Very Low Power Random Access Memory Cell", Apr. 1981, IBM TBD, vol. 23, No. 11, pp. 5007-5010.

Primary Examiner—Terrell W. Fears
Attorney, Agent, or Firm—Antonelli, Terry & Wands

[57] ABSTRACT

A static RAM having a plurality of memory cells. Each memory cell consists of driver MOST's that are connected to each other in a crossing manner, and transfer MOST's that connect storage nodes of the memory cell to the data lines. The driver MOST's are comprised of n-channel MOST's, and the transfer MOST's are comprised of p-channel MOST's.

8 Claims, 9 Drawing Figures ns: 4,653,025

RANDOM ACCESS MEMORY WITH HIGH DENSITY AND LOW POWER

FIELD OF THE INVENTION

The present invention relates to a semiconductor memory, and particularly to a memory using metal MOS oxide semiconductor transistors, hereinafter called a static memory, of a high packing density which consumes small amounts of electric power.

BACKGROUND OF THE INVENTION

FIG. 1 shows a memory cell in a known conventional MOS static random access memory, hereinafter called RAM, and in which resistors serve as a load. A static RAM is comprised of a plurality of such memory cells. In FIG. 1, reference numerals 1 to 4 denote n-channel MOS transistors, hereinafter referred to as MOST's, wherein 1 and 2 denote transfer MOST's, and 3 and 4 denote drive MOST's. Reference numerals 5 and 6 denote data lines, 7 denotes a word line, 8 and 9 denote load resistors, and data stored in the data storage nodes 12, 13 are retained by supplying an electric current from a power line 10 (potential $V_{CC}$). Reference numeral 11 denotes a ground line (potential $V_{SS}$). The load resistors 8, 9 are obtained by forming a polycrystalline silicon layer that is formed through the process of forming the gates of MOST's 1 to 4, or by forming a laminated polycrystalline silicon layer that is formed through a process different from the process of forming the gates, and by leaving a portion of the polycrystalline silicon layer as an intrinsic semiconductor or as a low doped region. The data is written onto the memory cell or is read out therefrom through data lines 5, 6 by raising the potential of the word line 7 from a low level to a high level.

SUMMARY OF THE INVENTION

Accompanying the progress in miniaturization techniques in recent years, RAM capacities have steadily increased, and the need has arisen to reduce the area occupied by the memory cells. Based upon the memory cells formed by the aforementioned conventional technique, the inventors have conducted a study in an effort to realize a large capacity static RAM, and have found the defects described below.

First, with the memory cell of the above-mentioned conventional construction, a mutual conductance gm ratio of about 1 to 4 is necessary between the transfer MOST's and the driver MOST's in order to obtain stable operation. This is, if the ratio W/L of the channel width W of a transfer MOST to the channel length L thereof is 1, then the driver MOST must have the ratio W/L of 4. Therefore, even if the transfer MOST is formed in a minimum transistor size, the channel width of the driver MOST must be increased, whereby the cell occupies an increased area in FIG. 1.

Second, there remains a problem of error which occurs when the surface of a semiconductor memory chip is irradiated with α-ray particles generated from impurities in a package material, and the data stored in the data storage node of a memory cell is inverted, thereby causing random error. In the aforementioned memory cell, a high level node voltage is stored when the data is written, i.e., when both the data line voltage and the word line voltage have assumed the level of power source voltage $V_{CC}$, i.e., a voltage $V_{CC}-V_{th}$ is stored being dropped from the power source voltage $V_{CC}$ by a threshold voltage $V_{th}$ of the transfer MOST. When a period of several microseconds passes from when the data has been written, the high level stored node voltage is raised to the level $V_{CC}$ through the load resistance. Where a period of about 100 milliseconds has passed from the writing of data, however, the high level voltage may be as low as $V_{CC}-V_{th}$, and error caused by α-rays develops easily. Furthermore, as the area of the memory cell decreases, the capacitance C of the memory cell, such as parasitic capacitance of the gate electrode, parasitic capacitance of the diffusion layer, etc. that exits at points 12, 13 in FIG. 1, decreases, and the stored electric charge Q ($=C\times V$, where V denotes a stored voltage) decreases. Accordingly, the frequency of error is greater than with that of the conventional devices even with the irradiation of the same amount of α-ray particles. To limit the frequency of error to a level which is the same as that of the conventional device, therefore, some means is required to increase the amount of stored electric charge to the same level as that of the conventional device.

The object of the present invention is to provide a static memory cell which eliminates the aforementioned defects inherent in the conventional art, and which occupies less area than the conventional circuit, making it possible to realize a large capacity static RAM. According to the present invention, furthermore, there is provided a semiconductor memory which occupies less area, which maintains high reliability comparable with that of the conventional devices, and which is suited for assembling a large capacity memory.

The static RAM according to the present invention employs memory cells each consisting of p-channel type MOST's that work as transfer MOST's, and n-channel type MOST's that work as driver MOST's.

DESCRIPTION OF THE PREFERRED EMBODIMENTS

Figure 1:
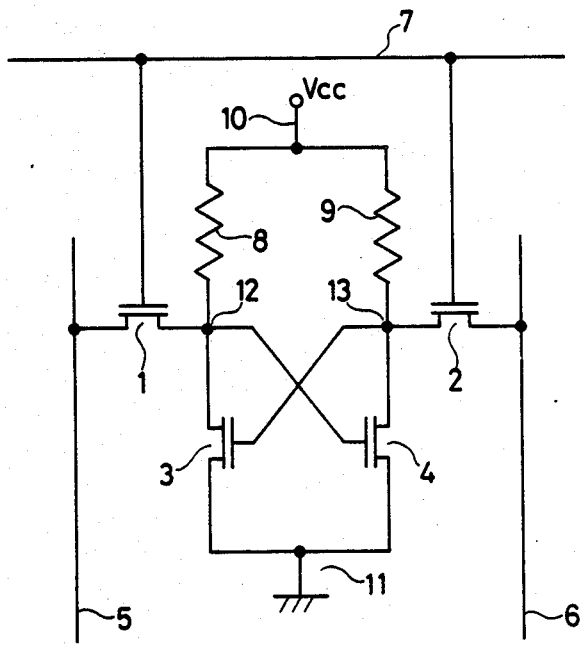
FIG. 1 is a diagram showing a conventional semiconductor memory.
Figure 2:
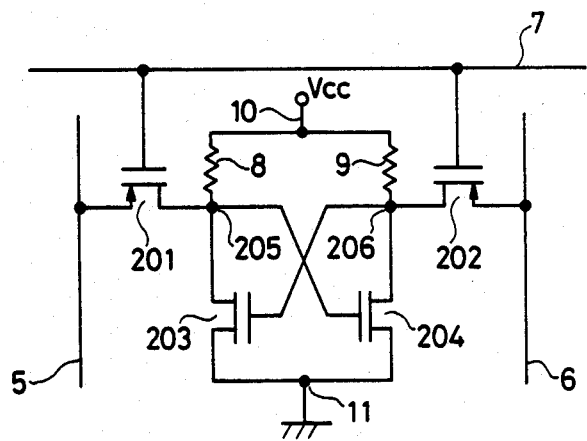
FIG. 2 is a circuit diagram showing a semiconductor memory according to the present invention.

FIG. 2 shows a memory cell of a static RAM according to a first embodiment of the present invention, wherein reference numerals 201 and 202 denote p-channel MOST's, 203 and 204 denote n-channel MOST's, and 205 and 206 denote storage nodes. A first features of the present invention resides in that the transfer MOST's are p-channel, different from the traditional n-channel MOST's. Usually, carriers in p-channel MOST's consist of positive holes having a mobility of about one-half that of the electrons that serve as carriers in the n-channel MOST's. If compared on the basis of the same size, therefore, the mutual conductance gm of the p-channel MOST is about one-half that of the n-channel MOST. Stable operation can therefore be obtained if the ratio of mutual conductance gm of the transfer MOST's 201, 202 to mutual conductance gm of the driver MOST's 203, 204, is set to be about 2, i.e., if the ratio W/L of these MOST's is set to be about 2. In this way, the area occupied by the memory cell can be reduced.

With the memory cell of FIG. 2, furthermore, the data is written onto the memory cell or is read out therefrom when the word line 7 is assuming voltage ($V_{SS}$) of a low level. Here, if the data line voltage is set to be $V_{CC}$, the stored node voltage assumes the level $V_{CC}$ at the time of writing the data. that is, there is no drop in the stored node voltage at the time of writing the data which according to the conventional memory cell is dropped by $V_{th}$. Namely, the amount of stored electric charge increases, and there is obtained a semiconductor memory which suppresses the development of error caused by α particles. According to the present invention, furthermore, the reading or writing operation of the memory cell is started by dropping the voltage of the word line 7 from the high level (level $V_{CC}$) to the low level (level $V_{SS}$). The MOST's exhibit a breaking characteristic that is faster than the rising characteristic. Compared with the conventional art in which the reading or writing operation of the memory is started by raising the voltage of the word line from the low level to the high level, therefore, the operations can be increased by about three times relying upon the switching characteristics of MOST's. An optimum semiconductor memory is obtained for a static RAM that features a short access time.

Figure 3:
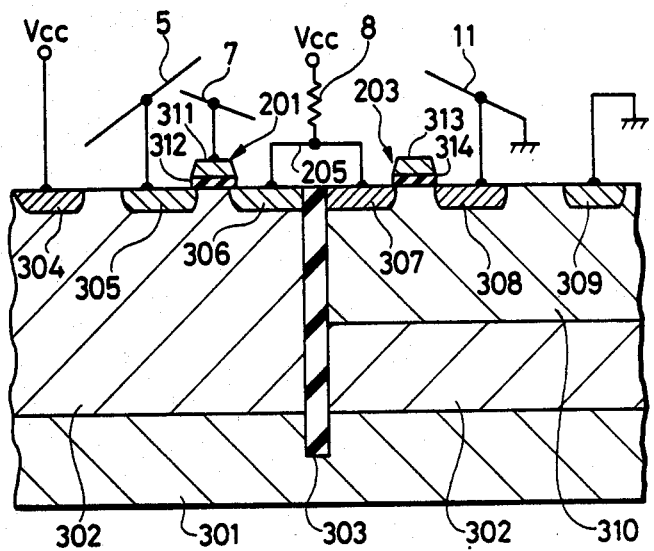
FIG. 3 is a diagram showing the structure thereof in cross section.

FIG. 3 is a section view of an integrated circuit according to a first embodiment of the present invention. In FIG. 3, an n-type semiconductor layer 302 and a p-type well layer 310 are formed on a highly doped n-type semiconductor substrate 302, to form a p-channel type MOST 201 in which p-type impurity layers 305, 306 serve as a source and a drain, and a layer 311 serves as a gate, and a layer 312 serves as a gate insulating film, as well as to form an n-channel type MOST 203 in which n-type impurity layers 307 and 308 serve as a drain and a source, a layer 313 serves as a gate, and a layer 314 serves as a gate insulating film. A resistor 8 for retaining the stored data is formed by separately forming a polycrystalline silicon layer between $V_{CC}$ and a storage node 205. The n-channel type MOST and the p-channel type MOST are isolated by an insulating material 303 having a narrow width on the plane but having a large depth, such as an $SiO_2$ film, a composite film of $SiO_2$ and $Si_3N_4$, or a composite layer made up to $SiO_2$, $Si_3N_4$ and a polycrystalline silicon buried inside thereof. Owing to the recent anisotropic etching technique, it is allowed to deeply form an isolation layer having (in terms of a plan) a width which is as narrow as that obtained by the selective oxidation technique such as LOCOS. FIG. 3 shows only the MOST's 201 and 203 of FIG. 2. In practice, however, the MOST's 202, 204 are also formed in the regions of the same type of conductivity being isolated by the isolation region 303. Reference numeral 304 denotes an n-type impurity layer, and 309 denotes a p-type impurity layer, that are provided to fix the potentials of the layers 302, 310 that serve as bodies of MOST's.

Figure 4:
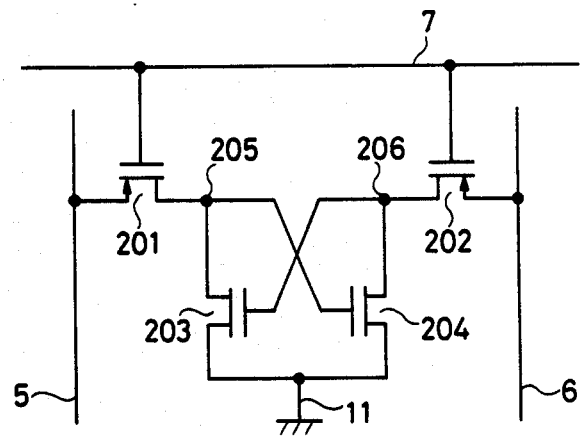
FIG. 4 is a circuit diagram of a second semiconductor memory according to the present invention.
Figure 5:
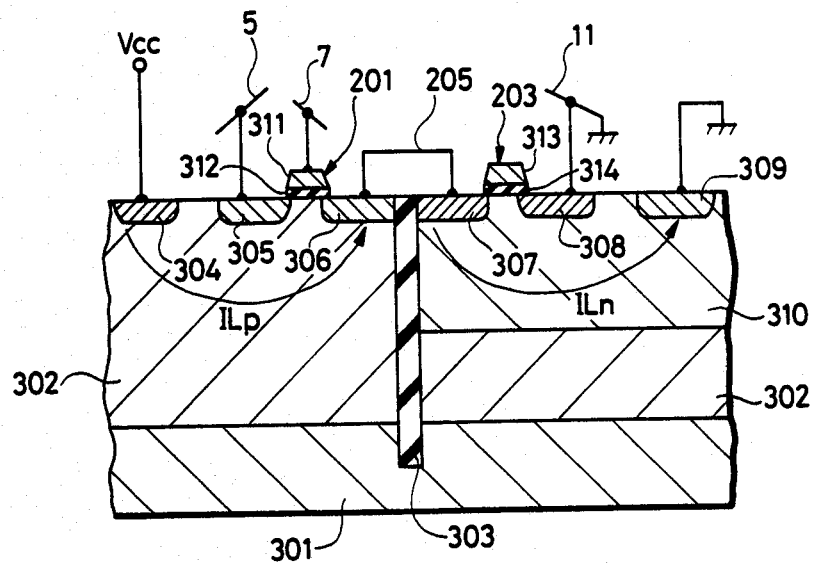
FIG. 5 is a diagram showing the structure thereof in cross section.

FIG. 4 shows a memory cell of a static RAM according to a second embodiment of the present invention, and FIG. 5 is a diagram showing in cross section an integrated circuit according to the second embodiment of the present invention. The feature of memory cell of FIG. 4 resides in that there is no resistance such as of a polycrystalline silicon layer that was formed in FIG. 2 between $V_{CC}$ and the storage node to statically retain the data. As shown in FIG. 5, the electric current for retaining the stored data flows as a current in reverse bias $IL_p$ from a terminal 304 of the p-channel type MOST that is fixed to the voltage of level $V_{CC}$ to the storage node 306. A current in reverse bias $IL_n$ also flows from the storage node 307 to the terminal 309 of the n-channel type MOST 309. It is therefore necessary to so design the device that $IL_p >> IL_n$.

With the memory cell of FIG. 4, it is difficult to control the resistance due to manufacturing conditions and, further, there is no need to use a load resistor composed of polycrystalline silicon which has a non-linear voltage dependency. In the memory cell of FIG. 4, furthermore, the current $IL_p$ for retaining data is not particularly dependent upon the size of the device. Even when the device is small and the memory cell occupies a reduced area to increase the capacity of memory, therefore, it is permissible to allow a current flow that is relatively independent of the terminal voltage based upon a very small current (smaller than $10^{11}$ A/cell). Accordingly, it is possible to realize a static RAM of a large capacity that can be backed up by a battery.

Figure 6:
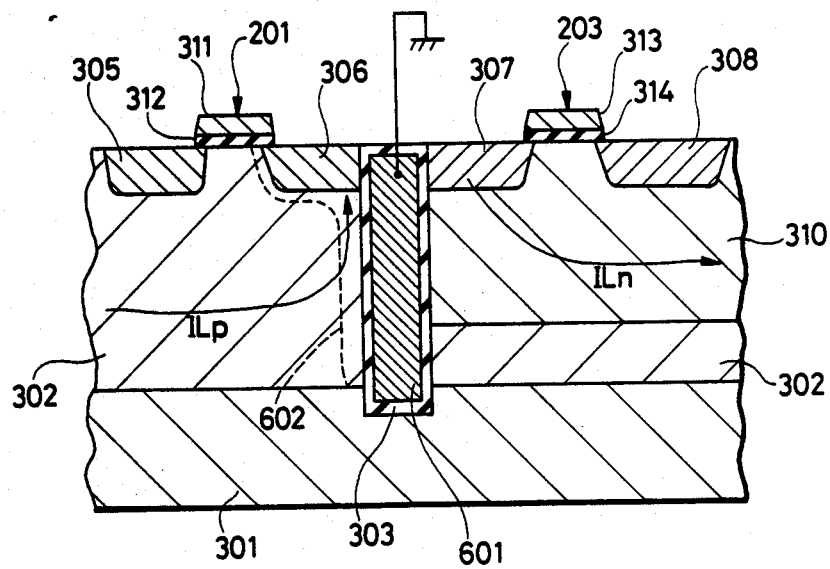
FIGS. 6 and 7 are diagrams showing in cross section a third semiconductor memory and a fourth semiconductor memory according to the present invention.

FIG. 6 is a section view of an integrated circuit according to a third embodiment of the present invention using memory cells to constitute a static RAM. According to this embodiment, an electrically conductive material 601 such as polycrystalline silicon is provided in the insulating layer 303, and the potential thereof is fixed to the level $V_{SS}$. Namely, the MOS structure is constituted by the electrically conductive material 601, insulating material 303 (such as $SiO_2$ film or a composite film of $SiO_2$ and $Si_3N_4$), and n-type semiconductor layer 302. When a voltage of the level $V_{SS}$ is applied to the electrically conductive material 601, a depletion layer 602 is formed in the semiconductor layer 302. Accordingly, the flow of current in reverse bias increases between the n-type semiconductor layer 302 fixed to the level $V_{CC}$ and the storage node 306. Even if the current in reverse bias $IL_n$ is increased to some extent due to manufacturing conditions, the static memory retains data stably.

Figure 7:
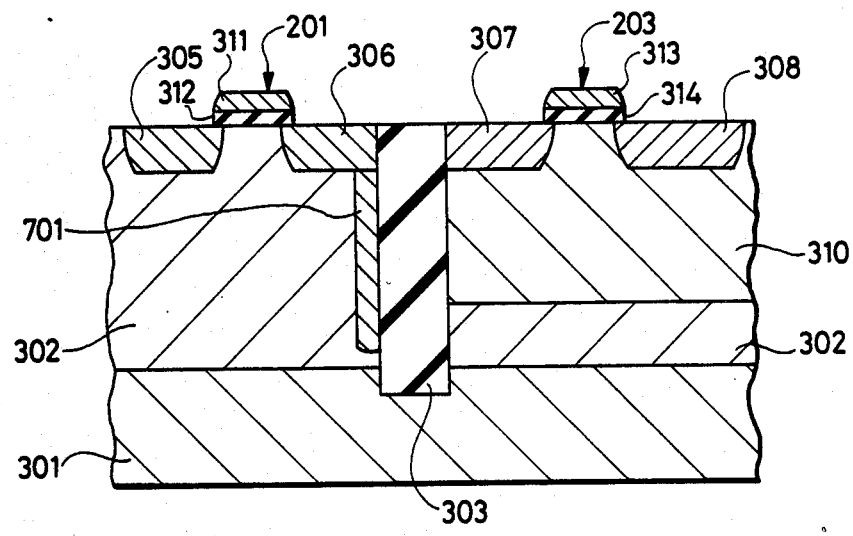

FIG. 7 is a section view of an integrated circuit according to a fourth embodiment of the present invention. According to this embodiment, the feature resides in the formation of an impurity layer 701 under the storage node 306 along the insulating layer 303, the impurity layer 701 having the p-type of conductivity, the same as that of the storage node 306. This is to increase the contacting area between the storage node and the semiconductor layer 302, in order to increase the current in reverse bias. This embodiment produces the same effects as those of the embodiment described with reference to FIG. 6.

The effects of the invention were explained above with reference to section views of FIGS. 6 and 7. In a practical memory cell array, however, a plurality of memory cells are arranged on a plane in the direction X-Y. Therefore, consideration must be give to isolating the individual MOST's. Even in FIGS. 6 and 7, consideration must be given to isolating the p-channel MOST's.

Figure 8:
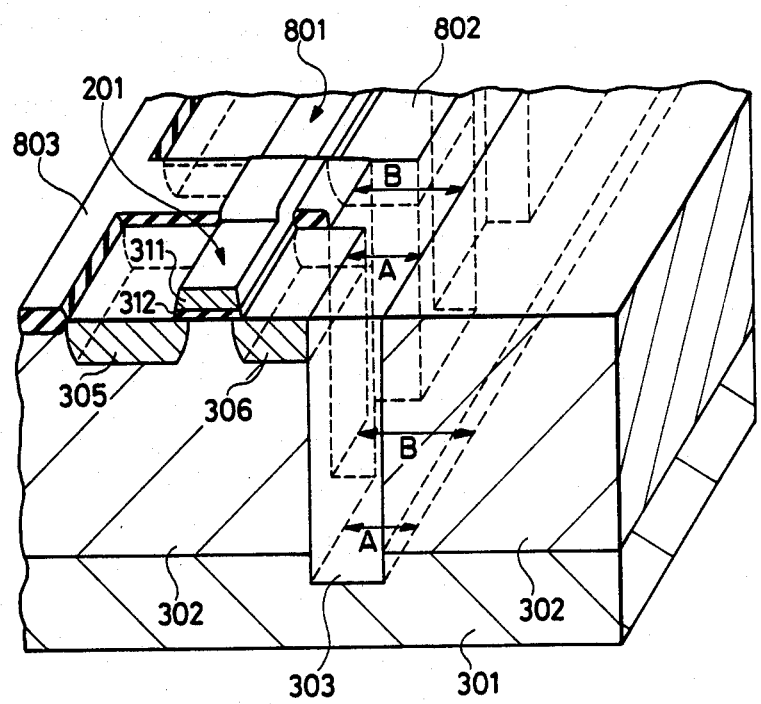
FIG. 8 is a bird's-eye of FIGS. 6 and 7.

FIG. 8 is a bird's-eye view showing a structure for isolating p-channel MOST's of the third embodiment of the present invention shown in FIG. 6. First and second p-channel MOST's 201, 801 are arranged in the direction of depth, and p-type impurity layers 306, 802 that serve as drains are provided in contact with an insulating layer 303. With the structure shown in FIG. 6, therefore, if the layers 306 and 802 are connected together via a depletion layer 602, the stored electric charge of a node having a high level voltage escapes into the other low level node, and no electric charge is stored therein. To prevent this in FIG. 8, the insulating layer is thick (not the difference between A and B in FIG. 8) so that a depletion layer is not formed between the layers 306 and 802. In FIG. 8, the surfaces of regions of black dots represent regions that may be depleted. In FIG. 8, further, reference numeral 803 denotes a locally oxidized film for isolating the elements.

In the structure shown in FIG. 7, unlike that of FIG. 8, thee is no need to change the thickness of the insulating layer. That is, an impurity layer (701 in FIG. 7) having the same type of conductivity as the layers 306, 802 should be formed adjacent to the surfaces of an insulating material of regions of black dots.

Figure 9:
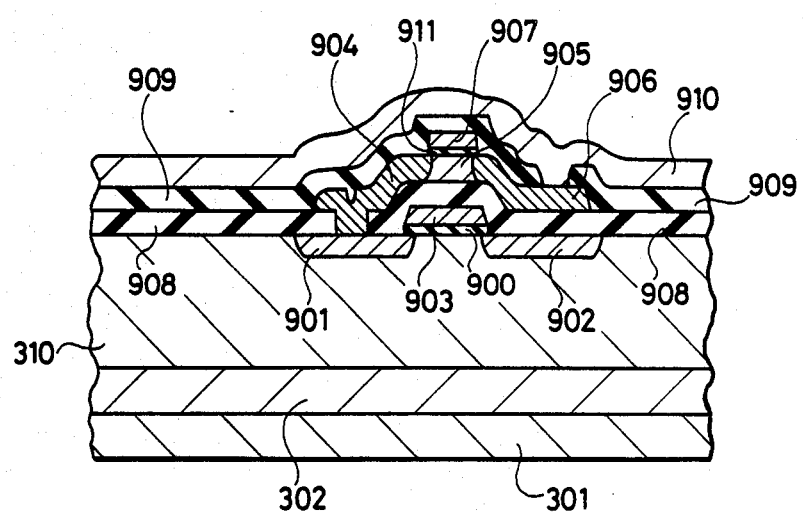
FIG. 9 is a diagram showing in cross section a fifth semiconductor memory according to the present invention.

FIG. 9 is a section view of an integrated circuit according to a fifth embodiment of the present invention, wherein reference numerals 901 and 902 denote n-type impurity layers that serve as drain and source regions of an n-channel MOST which has a gate electrode 903 and a gate insulating film 900. The layer 902 is connected to the electrode $V_{SS}$. The p-channel type MOST, on the other hand, is formed on the n-channel type MOST, and comprises p-channel type semiconductor layers 904, 906 that serve as a drain and a source, respectively, an n-type semiconductor layer 905 that serves as an n-type substrate, a layer 907 that serves as a gate electrode, and a layer 911 that serves as a gate insulating film. The layers 901 and 904 are connected together, and the layer 906 is connected to the data line composed of a metal wiring 910. FIG. 9 shows MOST's 201, 203 of FIG. 4, and the MOST's 202, 204 constitute a memory cell that is formed to stretch in the direction of depth in FIG. 9. In FIG. 9, furthermore, the layer 907 serves as a word line, and the data stored in the layers 901 and 904 is retained by a leakage current that flows across the source 906 and the drain 904 of the p-channel MOST from the data line 910. This stems from the fact that the semiconductor layers 904, 905 and 906 that are formed on the insulating layer 908 are converted from the state of polycrystalline silicon into the crystalline state of silicon by a heating means such as a laser, and that the leakage current flows due to mismatching of crystallinity in the contacting surfaces between the layers 905 and 908. If the leakage current can be reduced to an extent comparable with that of pure silicon by improving the manufacturing conditions, then the storage nodes 901, 904 should be provided with a load for supplying electric current using polycrstalline silicon or the like.

According to the present invention, the number of elements formed on the plane of silicon substrate 310 is two per bit of memory cell. Therefore, the area which is occupied can be nearly halved compared with the example of FIG. 4, making it possible to provide memory cells that are best suited for constituting a static RAM of a large capacity.

Though FIG. 9 shows the structure in which the p-channel MOST is formed on the n-channel MOST, the same effects are obtained even when the order of their formation is reversed.

According to the present invention as described above, it is possible to provide a static memory cell which occupies a reduced area and which has increased resistance against α-rays, presenting great effects for realizing a static RAM having a large capacity.

What is claimed is:

1. A semiconductor memory comprising:
    a plurality of memory cells each of which is comprised of:
        a first n-channel MOST and a second n-channel MOST, each of which is provided in a p-type semiconductor body, the gate of said first n-channel MOST being connected to the drain of said second n-channel type MOST, and the gate of said second n-channel type MOST being connected to the drain of said first n-channel type MOST; and
        a first p-channel MOST and a second p-channel MOST, each of which is provided in an n-type semiconductor body, the drain of said first p-channel MOST being coupled to the drain of said first n-channel MOST to constitute a first storage node, and the drain of said second p-channel MOST being coupled to the drain of said second n-channel MOST to constitute a second storage node;
    a plurality of first and second data lines each of which is coupled to the source of the first and second p-channel MOSTs in the memory cells;
    a plurality of word lines coupled to the gates of the first and second p-channel MOSTs in the memory cells;
    a first terminal region provided in said n-type body and coupled to a first power source terminal so as to bias said drains of the p-channel MOSTs in reverse and supply a current in reverse bias ILp to said drains of the p-channel MOSTs; and
    a second terminal region provided in said p-type body and coupled to a second power source terminal so as to bias said drains of the n-channel MOSTs in reverse,
    wherein said current in reverse bias ILp is greater than a current in reverse bias ILn that flows from said drains of the n-channel MOSTs into said second terminal region.

2. A semiconductor memory according to claim 1, wherein the ratio of mutual conductance of the first and second p-channel MOSTs to mutual conductance of the first and second n-channel MOSTs is set to be about 1:2.

3. A semiconductor memory according to claim 1, wherein the ratio of channel width/channel length of the first and second p-channel MOSTs to channel width/channel length of the first and second n-channel MOSTs is set to be about 1:2.

4. A semiconductor memory according to claim 1. further including means to select a word line by lowering the voltage of the word line from a high level to a low level.

5. A semiconductor memory according to claim 1, further comprising a trench region which is provided so as to isolate said p-type body from said n-type body, said trench region having a narrow width but a large depth.

6. A semiconductor memory according to claim 5, wherein an insulating material is provided in said trench region.

7. A semiconductor memory according to claim 5, wherein a conductive material is provided in said insulating material and is set at a certain potential so as to form a depletion layer along said trench in said n-type body.

8. A semiconductor memory according to claim 5, further comprising a p-type region which is provided under the drain of said p-channel MOST along said trench in said n-type body.

* * * * *